(12) United States Patent
Haimovich et al.

(10) Patent No.: US 6,543,461 B2
(45) Date of Patent: Apr. 8, 2003

(54) BUFFER SYSTEM FOR A WAFER HANDLING SYSTEM FIELD OF THE INVENTION

(75) Inventors: Eli Haimovich, Cupertino, CA (US); Eran Dvir, Givatayim (IL)

(73) Assignee: Nova Measuring Instruments Ltd., Rehovot (IL)

(*) Notice: Subject to any disclaimer, the term of this patent is extended or adjusted under 35 U.S.C. 154(b) by 127 days.

(21) Appl. No.: 09/725,932

(22) Filed: Nov. 30, 2000

(65) Prior Publication Data

US 2001/0001888 A1 May 31, 2001

Related U.S. Application Data

(63) Continuation-in-part of application No. 09/248,070, filed on Feb. 11, 1999, now Pat. No. 6,212,961.

(51) Int. Cl.$^7$ .................................................. B08B 3/04
(52) U.S. Cl. ...................... 134/61; 134/84; 134/133; 134/137; 134/902
(58) Field of Search ........................ 134/61, 66, 84, 134/133, 137, 140, 164, 902

(56) References Cited

U.S. PATENT DOCUMENTS

| | | | | |
|---|---|---|---|---|
| 4,015,615 A | * | 4/1977 | Weber et al. | |
| 5,345,639 A | * | 9/1994 | Tanoue et al. | |
| 5,485,644 A | * | 1/1996 | Shinbara et al. | |
| 5,498,294 A | * | 3/1996 | Matsuhita et al. | |
| 5,518,542 A | * | 5/1996 | Matsukawa et al. | |
| 5,555,634 A | * | 9/1996 | Uchiyama et al. | |
| 5,667,535 A | * | 9/1997 | Kashara | |
| 6,079,073 A | * | 6/2000 | Macekawa | |
| 6,115,867 A | * | 9/2000 | Nakashima et al. | |
| 6,245,156 B1 | * | 6/2001 | Taniyama et al. | |

FOREIGN PATENT DOCUMENTS

| | | | |
|---|---|---|---|
| JP | 3-196626 | * | 8/1991 |
| JP | 4-233729 | * | 8/1992 |
| JP | 4-294535 | * | 10/1992 |

* cited by examiner

*Primary Examiner*—Frankie L. Stinson
(74) *Attorney, Agent, or Firm*—David Klein; Dekel Patent Ltd.

(57) ABSTRACT

A buffer station for an article handling system, the handling system having a general path along which it moves when handling the article, the buffer station including at least two supporting assemblies including supporting elements forming a supporting plane each capable of supporting an article within the supporting plane and located so as to support the article within the general path, at least two receptacles for liquid in which the at least two supporting assemblies are disposed, and at least two drivers associated with the at least two supporting assemblies and the receptacles for shifting them in and out of the general path.

14 Claims, 19 Drawing Sheets

BUFFER SYSTEM FOR A WAFER HANDLING SYSTEM FIELD OF THE INVENTION

CROSS-REFERENCE TO RELATED APPLICATIONS

This application is a continuation-in-part of U.S. patent application Ser. No. 09/248,070, filed Feb. 11, 1999, now U.S. Pat. No. 6,212,961, assigned to the common assignees of the present invention.

FIELD OF THE INVENTION

The present invention relates to handling and robotics systems, in general, and to such in semiconductor processing control systems, in particular.

BACKGROUND OF THE INVENTION

Reference is made to FIG. 1, which illustrates a prior art process environment 10 in a semiconductor fabrication plant. In general, process environment 10 comprises a process unit 2, such as a chemical mechanical polisher, at least one load/unload cassette station 4 (two are shown), an integrated metrology tool 6 and a robot 8.

The robot 8 transfers wafers to and from both the processing unit 2 and the cassette stations 4. However, the integrated metrology tool 6 requires its own handling system in order to transfer the wafer to be measured from the robot 8 to a measuring location on tool 6 and vice versa.

FIGS. 2A, 2B, 2C, 2D, 2E and 2F illustrate the operation of tool 6 and robot 8 using a handling system 16 to work with an integrated metrology tool having a measuring unit 15. One exemplary process environment uses the NOVAS-CAN 210 integrated metrology tool, commercially available from Nova Measuring Instruments Ltd. of Rehovot, Israel, and its handling system. The handling system 16 is composed of a bent arm 17 connected to a gripper 18. The latter can be any gripper that can hold a wafer, such as a vacuum gripper.

The arm 17 slides vertically on a vertical rail 14 and reaches above the measuring unit 15 in order to place a new wafer in a measuring position and/or to return a measured wafer to the robot 8. Between the uppermost position of gripper 18 and measuring unit 15 there is a supporting station 19 comprised of two supporting beams 24 and 25, each of which has a supporting base 26. Supporting beams 24 and 25 are connected to a rail 30 by a relative motion unit 32. Unit 32 is designed to provide relative motion to supporting beams 24 and 25 such that they move toward and away from each other, as indicated by arrows 34 and 36. A coupling member 54 connects supporting station 19 to the measuring unit 15.

As shown in FIG. 2B, with supporting beams 24 and 25 in their most separated positions, gripper 18 can freely pass through the buffer station 22, even when loaded with a wafer. As shown in FIG. 2C, with supporting beams 24 and 25 in their closest positions, a wafer can be held on each of supporting base 26 and gripper 18 cannot pass through.

In operation, and as shown in FIG. 2D, the robot 8 arrives at integrated tool 6 loaded with a new wafer W on an arm 9. At this point, handling system 16 is waiting in its uppermost position. Robot 8 places the wafer W on supporting bases 26, after which, as shown in FIG. 2E, handling system 16 moves down and picks up the wafer W. Robot 8 then leaves integrated tool 6 to conduct other missions while handling system 16, loaded with the wafer W, continues down, until, as shown in FIG. 2E, it places the wafer, working surface down, in a measuring position on the measuring unit 15. Typically, the measuring position includes supports that support the wafer on its edges (not shown). Since supporting beams 24 and 25 have moved towards and away from the plane of the paper, the supporting station 19 is shown in FIG. 2F with dashed lines.

It is noted that robot 8 leaves tool 6 empty and must arrive at tool 6 unloaded in order to take back a measured wafer. Thus, robot 8 is not optimally exploited, i.e., a disadvantage considering that the robot 8 is the "bottle neck" in process environment 10 (FIG. 1).

Prior art systems solve this problem in multiple ways. One exemplary robot is the DBM 2400 series of Equipe Technologies, Mountain-View, Calif., USA. This robot has two separate arms. A second exemplary robot is the PerMer 6100 robot of Cybeq Systems, Sunnyvale, Calif., USA. The robot can hold two wafers, one on each side of its arm, and rotates the arm 180 degrees in order to switch wafers. For both prior art systems, the robot arrives at the supporting station loaded with a new wafer, and the free arm or side faces the supporting station. The free arm (side) loads a processed wafer from the supporting station, after which, the arm (side) with the new wafer is loaded onto the supporting station. The robot then returns loaded with the processed wafer.

It will be appreciated that these solutions require additional footprint since, during their operation, the two arms (sides) are loaded with both new and processed wafers. This may be a drawback in crowded processing environments.

SUMMARY OF THE INVENTION

It is therefore an object of the present invention to overcome the aforementioned limitations of the prior art.

There is thus provided in accordance with a preferred embodiment of the present invention a buffer station for an article handling system, the handling system having a general path along which it moves when handling the article, the buffer station comprising at least two supporting assemblies comprising supporting elements forming a supporting plane each capable of supporting an article within said supporting plane and located so as to support said article within said general path, at least two receptacles for liquid in which said at least two supporting assemblies are disposed and at least two drivers associated with said at least two supporting assemblies and said receptacles for shifting them in and out of said general path.

In accordance with a preferred embodiment of the present invention the supporting elements include at least two supporting bases each capable of holding a wafer thereon when the supporting elements are in the first mode.

There is also in accordance with a preferred embodiment of the present invention a buffer station for a wafer handling system, the handling system having a general path along which it moves when handling the wafer, the buffer station including at least two pairs of supporting elements each capable of supporting at least one wafer therebetween and located so as to support the wafer within the general path, a receptacle in which at least one of the pairs of supporting elements are disposed, the receptacle being at least partially filled with a liquid and adapted to hold at least one wafer at least partially submerged in the liquid, and one motion unit per pair of supporting elements for shifting its associated pair of supporting elements in and out of the general path and when the supporting elements are in the general path, for providing relative motion to its associated pair of supporting elements such that, in a first mode, the supporting elements support the wafer within the general path and, in a second mode, the supporting elements are sufficiently separated so as not to disturb the motion of the handling system when the handling system holds a wafer.

In accordance with a preferred embodiment of the present invention each of the supporting elements includes at least one supporting base each capable of holding a wafer thereon when the supporting elements are in the first mode.

Further in accordance with a preferred embodiment of the present invention the at least one supporting base includes two supporting bases.

Still further in accordance with a preferred embodiment of the present invention the at least two pairs of supporting elements include at least three pairs of supporting elements.

Additionally in accordance with a preferred embodiment of the present invention a liquid reservoir is in fluid communication with the receptacle.

In accordance with a preferred embodiment of the present invention a recirculation conduit is in fluid communication with the receptacle and the liquid reservoir, adapted to recirculate a liquid between the receptacle and the liquid reservoir. The liquid reservoir may be a source of purified, e.g. distilled water.

Further in accordance with a preferred embodiment of the present invention the receptacle includes a flexible, foldable gate, which when closed substantially seals flow of liquid from the receptacle.

There is also provided in accordance with a preferred embodiment of the present invention a processing unit for processing at least one semiconductor wafer, the unit including a processing station for processing the at least one wafer, a measuring station for measuring the at least one wafer, a robot for moving the at least one wafer between the processing and measuring stations, a wafer handling system operating in conjunction with the measuring station for moving the at least one wafer to and from a measuring location on the measuring unit, a buffer station associated with the wafer handling system for receiving measured and unmeasured wafers thereby to enable the robot to arrive at and leave the measuring station with at least one wafer thereon, and a receptacle in which the buffer station is disposed, the receptacle being at least partially filled with a liquid and adapted to hold the at least one wafer at least partially submerged in the liquid.

In accordance with a preferred embodiment of the present invention at least one of the supporting elements is movable along and connected to a centering driver.

Further in accordance with a preferred embodiment of the present invention there is also provided a foldable gate, which when closed substantially seals flow of liquid from said receptacle.

Still further in accordance with a preferred embodiment of the present invention the gate is flexible.

In accordance with a preferred embodiment of the present invention each of the supporting assemblies comprise at least two supporting elements forming the supporting plane.

Further in accordance with a preferred embodiment of the present invention the supporting assemblies comprise at least three supporting elements forming the supporting plane.

The buffer station may be provided with receptacles having one or more conduits in fluid communication with a liquid source, along with one or more drain conduits that are preferably provided with one or more drain valves operable by a control unit.

Preferably the liquid used in the buffer station is purified or distilled water.

Additionally in accordance with a preferred embodiment of the present invention the buffer station may include a pre-alignment unit located within a general path of said handling system.

Still further in accordance with a preferred embodiment of the present invention the pre-alignment unit is movable in and out said general path or is tilted with respect to a general path of said handling system.

BRIEF DESCRIPTION OF THE DRAWINGS

The present invention will be understood and appreciated more fully from the following detailed description taken in conjunction with the appended drawings in which.

14A and 14B showing the flexible gate before and after folding, respectively.

DETAILED DESCRIPTION OF THE PRESENT INVENTION

The present invention provides a handling system for an integrated monitoring tool that includes a buffer station. Thus, the robot operation becomes less dependent or even independent of the operation of the integrated monitoring tool, generally resulting in increased throughput.

The present invention can be applied to any type of integrated monitoring tool. The term "integrated monitoring tool", as used herein, refers to a monitoring (e.g., metrology, inspection) apparatus that is preferably physically installed inside a processing unit or attached to it. However, it can also be separated from the processing unit, as necessary. The monitoring tool is usually dedicated to the specific processing unit and wafers are preferably transferred to the apparatus by the same robot that serves the processing unit. As mentioned hereinabove, one xemplary integrated monitoring tool is the NOVASCAN 210, but the present invention incorporates any other integrated monitoring tool.

Furthermore, the present invention can be applied to any processing environment where a wafer is to be unloaded by a robot at a location (e.g., stand alone metrology or inspection tool) from which the same wafer should later be reloaded by a robot, the same one or otherwise.

The processing unit to which the integrated monitoring tool is attached can be any processing unit in a fabrication plant. For example, it can be a chemical mechanical polisher, such as those manufactured by Strasbaugh Inc. of San-Luis-Obispo, Calif., by Applied Materials Inc. of Santa Clara, Calif., or a phototrack manufactured by SVG Silicon Valley Group of San-Jose, Calif., or by FSI International, of Chaska, Minn., all of the USA. The processing unit can also be an etching, physical vapor deposition unit or chemical vapor deposition unit.

Figure 1:
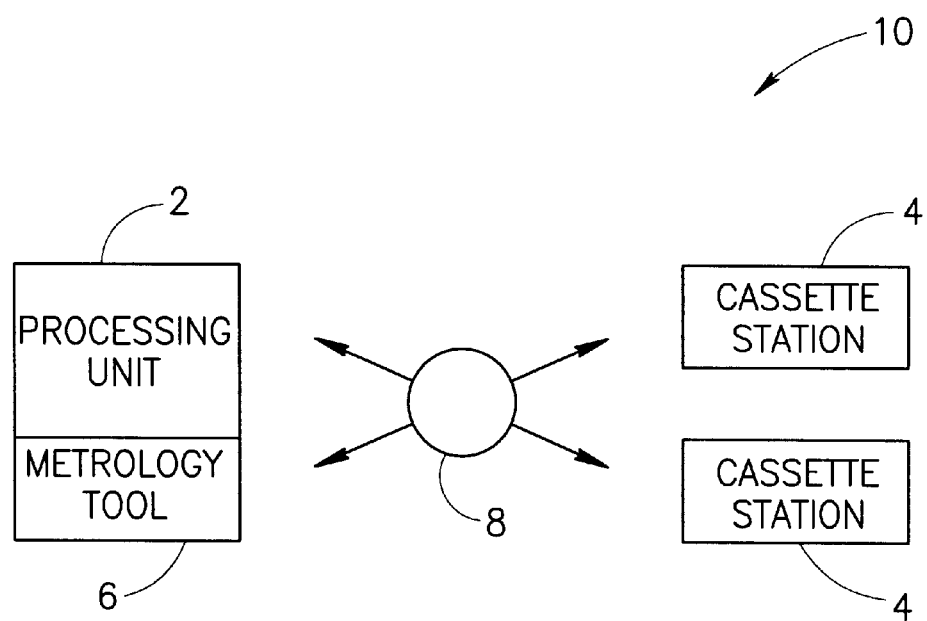
FIG. 1 is a schematic illustration of a prior art process environment in a semiconductor fabrication plant.
Figure 2A:
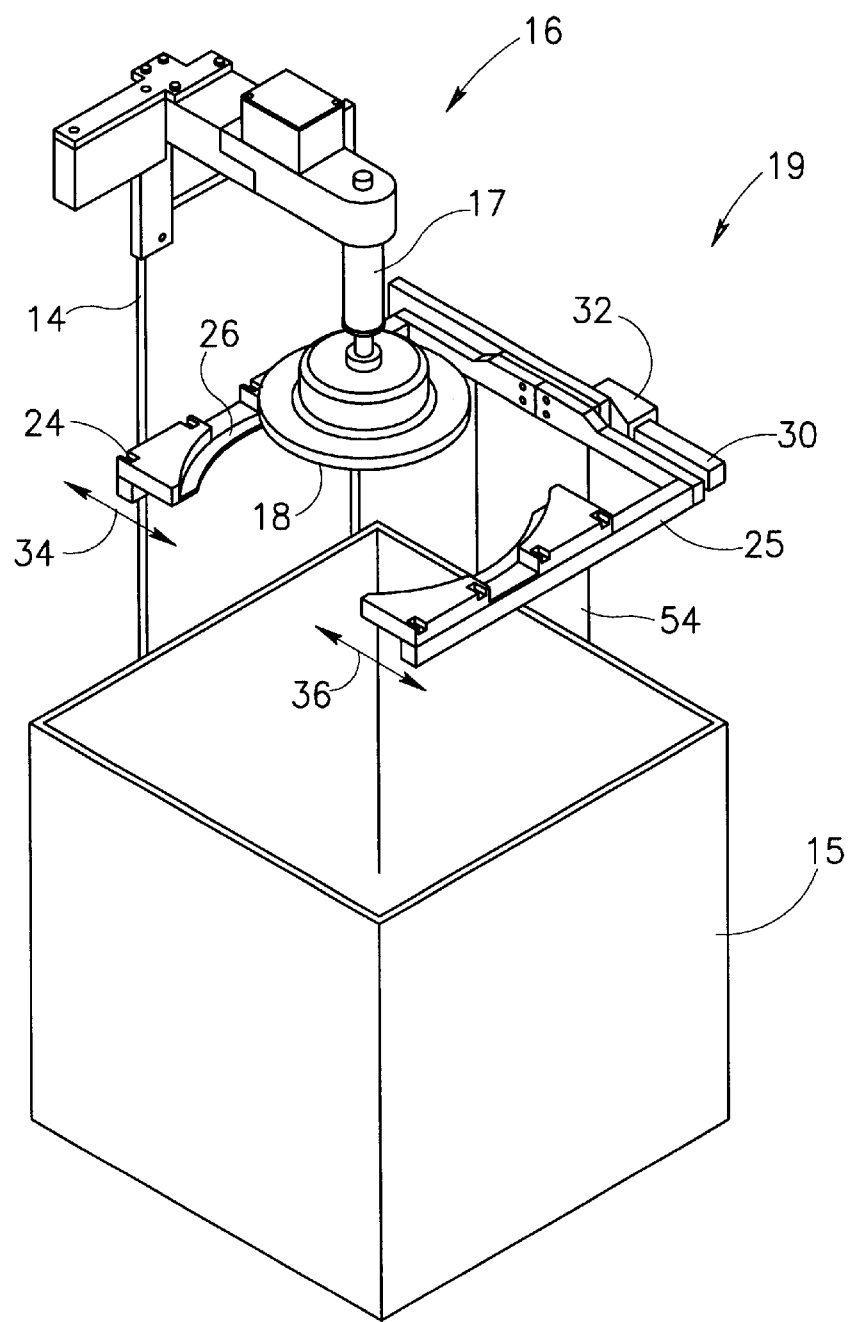
FIGS. 2A, 2B, 2C, 2D, 2E and 2F are schematic illustrations of an integrated metrology tool and its handling system during prior art operation with a robot.
Figure 2B:
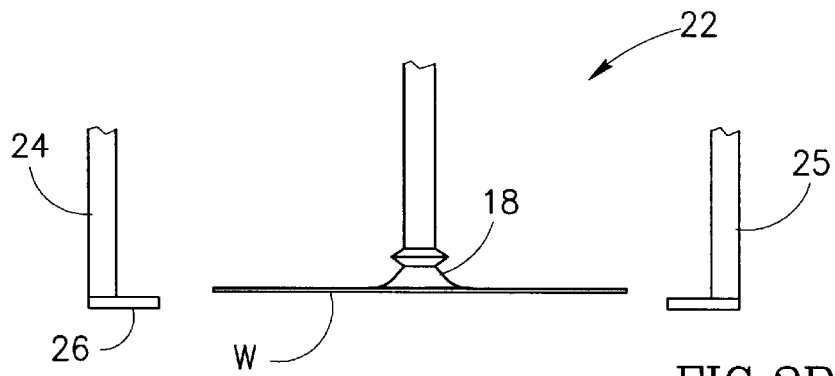
Figure 2C:
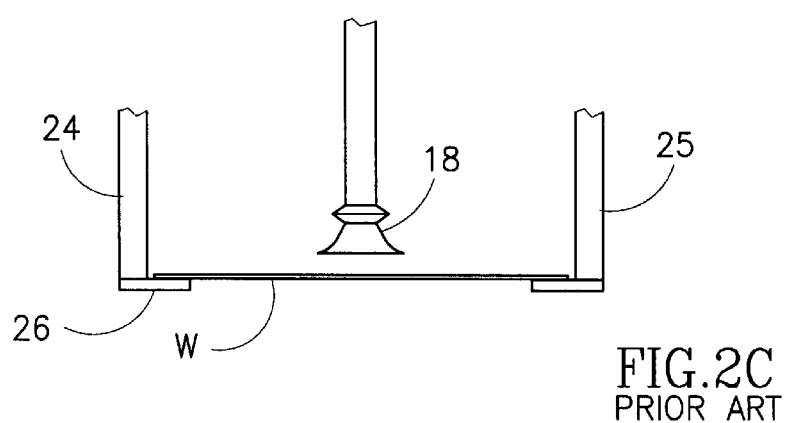
Figure 2D:
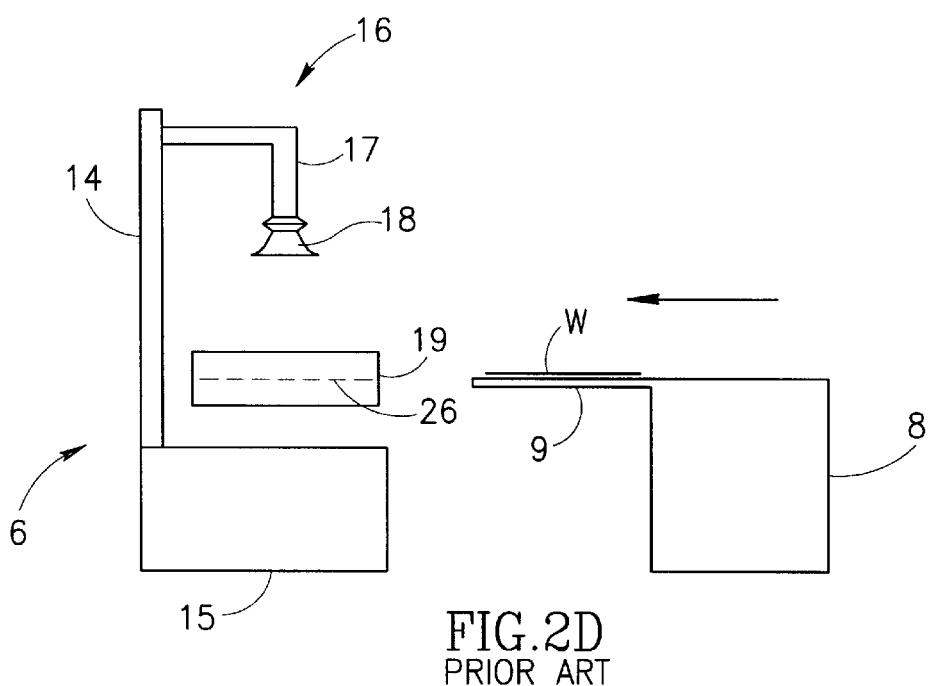
Figure 2E:
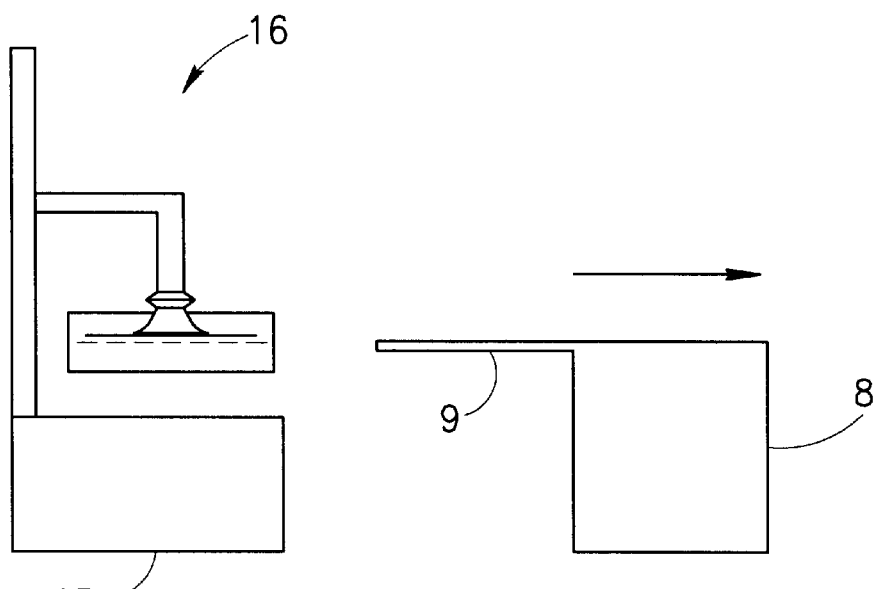
Figure 2F:
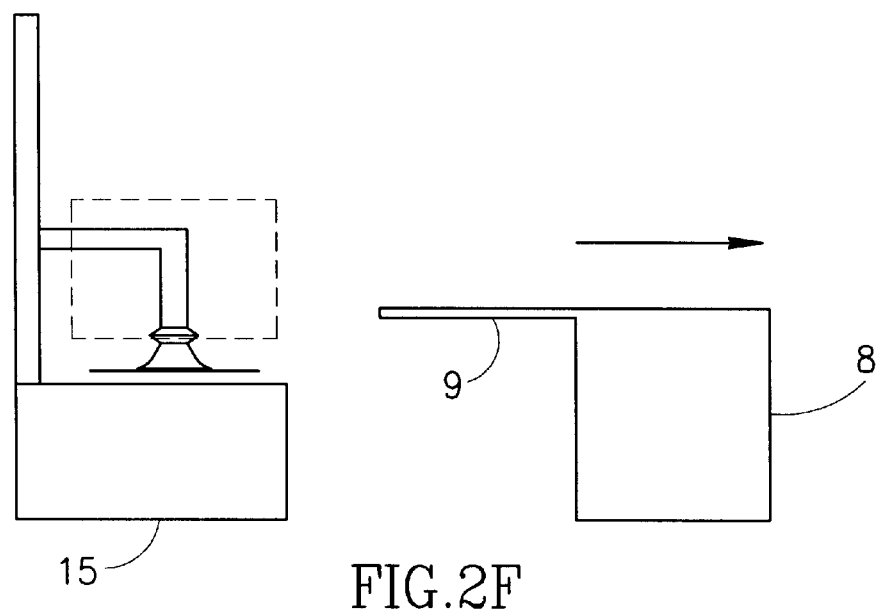
Figure 3A:
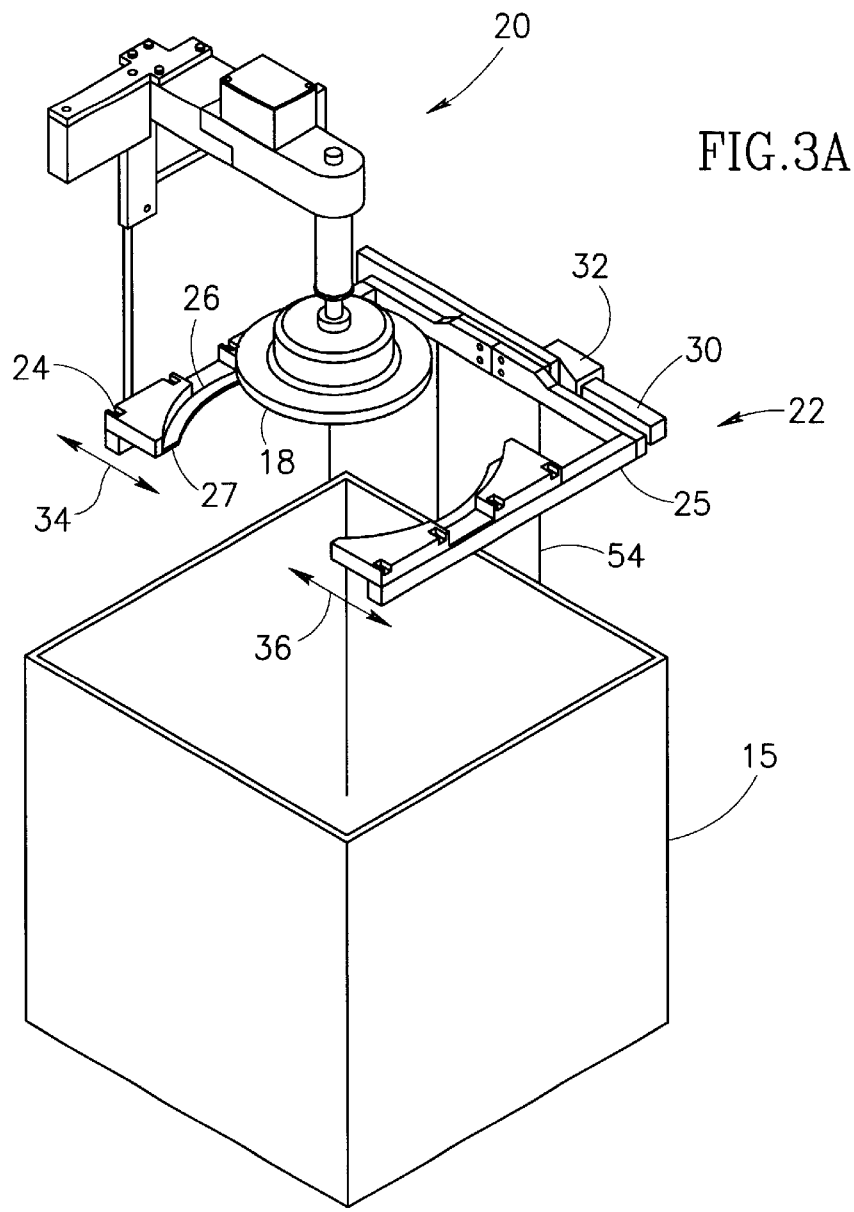
FIG. 3A is a schematic illustration of an integrated monitoring tool and handling system, constructed and operative in accordance with a preferred embodiment of the present invention.
Figure 3B:
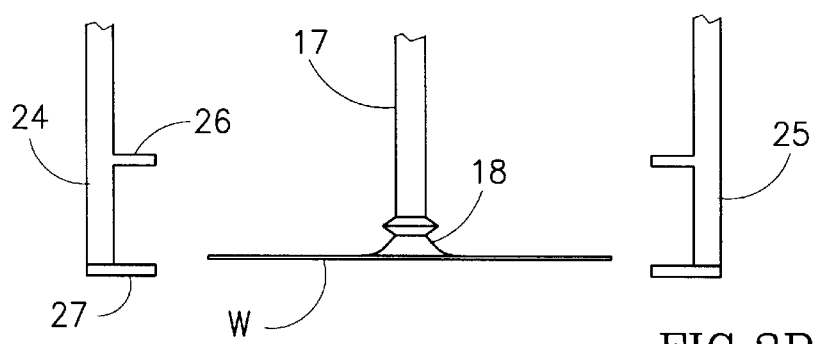
FIG. 3B is a schematic illustration of a buffer station forming part of the handling system of FIG. 3A.

Reference is made to FIGS. 3A and 3B which respectively illustrate a handling system 20 for the integrated tool, constructed and operative in accordance with a preferred embodiment of the present invention, and a buffer station 22 forming part of the handling system 20. FIG. 3A is an isometric illustration of the handling system and FIG. 3B is a schematic front view of buffer station 22. FIGS. 3 also show elements discussed previously and thus, similar reference numerals refer to similar elements.

The handling system 20 is similar to that described in FIGS. 2 and thus, will not be described herein in more detail. Buffer station 22 is similar to supporting station 19 and comprises two supporting beams 24 and 25. However, in accordance with a preferred embodiment of the present invention, buffer station 22 has two supporting bases 26 and 27, detailed in FIG. 3B, rather than a single base 26 as in the prior art. This enables buffer station 22 to buffer wafers such that a standard, one-armed (single-end effector) robot can arrive with a new wafer and can return with a processed wafer, rather than arriving or returning empty, as in the prior art, will be described in more detail hereinbelow.

Similarly to supporting station 19, supporting beams 24 and 25 are connected to rail 30 by relative motion unit 32. Unit 32 enables supporting beams 24 and 25 to move toward and away from each other, as indicated by arrows 34 and 36.

Figure 4A:
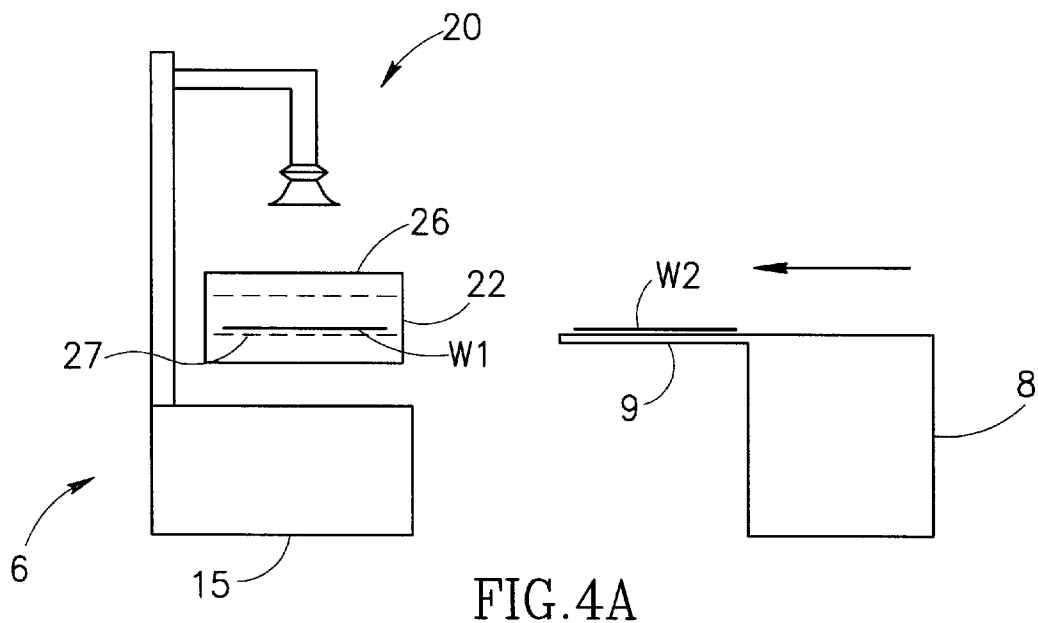
FIGS. 4A, 4B and 4C are schematic illustrations indicating the operation of the system of FIG. 3A.
Figure 4B:
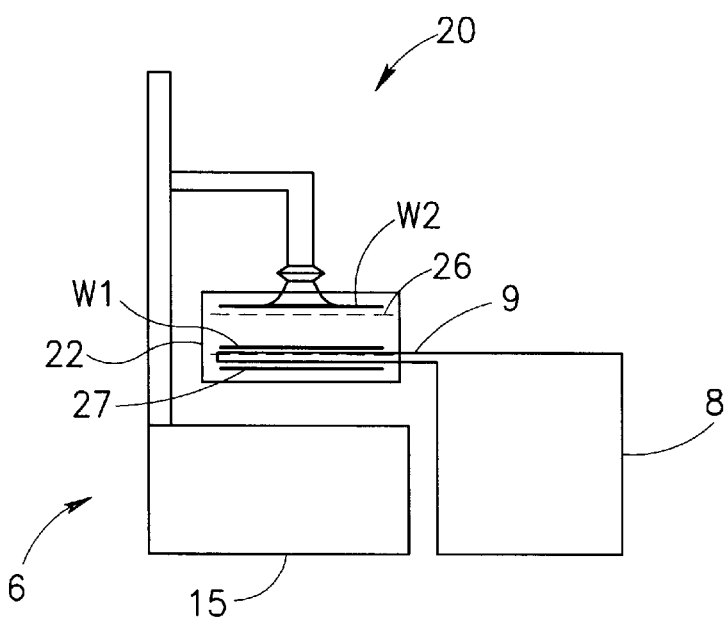
Figure 4C:
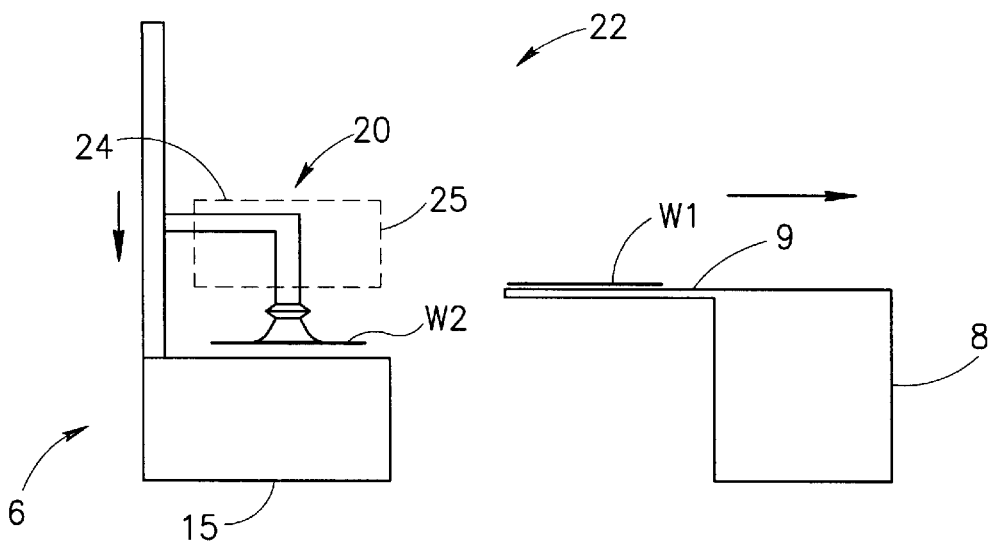

Reference is made to FIGS. 4A, 4B and 4C which are schematic side views of handling system 20 of FIG. 3 with robot 8 and illustrate their combined operation.

As illustrated in FIG. 4A, a measured wafer W1 is present in buffer station 22 on the lower supporting bases 27. At the same time, robot 8 arrives (or is already waiting) with a wafer W2, to be measured by measuring unit 15, and places it onto upper supporting bases 26.

From this point in time, robot 8 and handling system 20 can independently operate, as illustrated in FIG. 4B. Handling system 20 loads new wafer W2 from upper supporting bases 26. Before the robot 8 finishes loading the measured wafer W1, the handling system 20 can start centering and/or pre-aligning the wafer W2, as discussed in more detail hereinbelow. Generally simultaneously, robot 8 loads measured wafer W1 onto its arm 9 from lower supporting bases 27. At the next stage, shown in FIG. 4C, robot 8 leaves tool 6 with measured wafer W1 while handling system 20 can lower new wafer W2, through the now open supporting beams 24 and 25 of buffer station 22, towards and on measuring unit 15. Since, in FIG. 4C, supporting beams 24 and 25 have moved towards and away from the plane of the paper, the buffer station 22 is shown with dashed lines.

It will be appreciated that buffer station 22 provides the following advantages:

1) It enables robot 8 to unload a wafer to be measured and to load a measured wafer, in one visit to integrated tool 6. This minimizes robot movements and thus, saves time.

2) Since buffer station 22 is mounted on handling system 20, no additional footprint is needed for buffer station 22. However, it should be noted that, if no foot print limitations exist, the buffer station of the present invention may be located out of the moving path of the gripper. This requires that the gripper have an additional translation mechanism (not shown) in order to reach the buffer station.

In accordance with another preferred embodiment of the present invention, in addition to buffering, buffer station 22 provides the ability to center the wafers prior to placing them on measuring unit 15. This is illustrated in FIGS. 5A and 5B to which reference is now made.

Figure 5A:
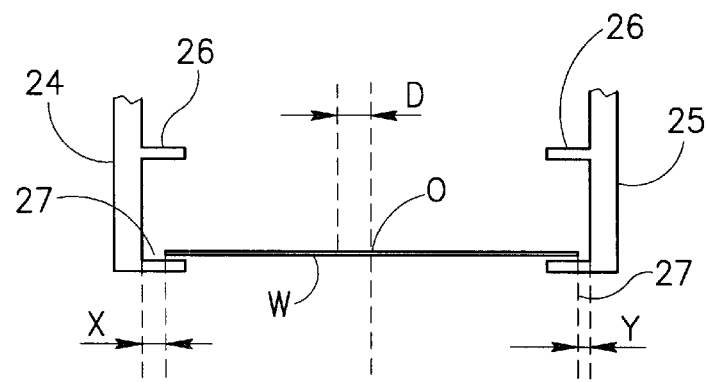
FIGS. 5A and 5B are schematic illustrations indicating a centering operation of the system of FIG. 3A.

FIG. 5A illustrates supporting beams 24 and 25 after robot 8 has placed wafer W on supporting bases 27 but before beams 24 and 25 have reached their closest positions. Typically, robot 8 does not accurately place wafer W and thus, a center O of wafer W is shifted by a distance D from its desired measurement or processing location. Typically, robot 8 places wafer W unevenly such that, between the edges of wafer W and supporting beams 24 and 25 are typically gaps x and y, respectively, wherein $D \leq x+y$.

Figure 5B:
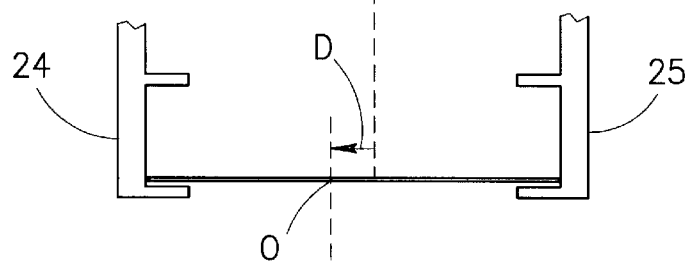

However, as supporting beams 24 and 25 move towards their closest positions, shown in FIG. 5B, they push wafer W between them. Since buffer 22 is mounted on handling system 20 so that the centers of the circles defined by supporting bases 26 and 27 are aligned with the center of the measuring position, once supporting beams 24 and 25 arrive at their final position, the center O of wafer W will be at the desired location. This is shown in FIG. 5B.

Figure 6A:
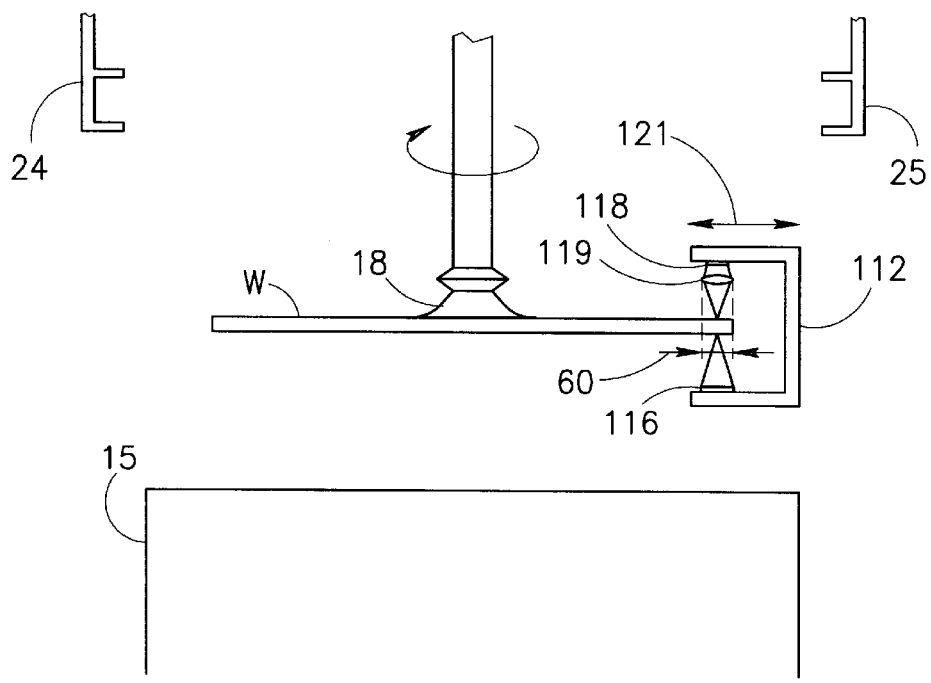
FIGS. 6A and 6B are two schematic illustrations of an alternative embodiment of the integrated monitoring tool of the present invention having a pre-alignment unit, in two different stages of operation.
Figure 6B:
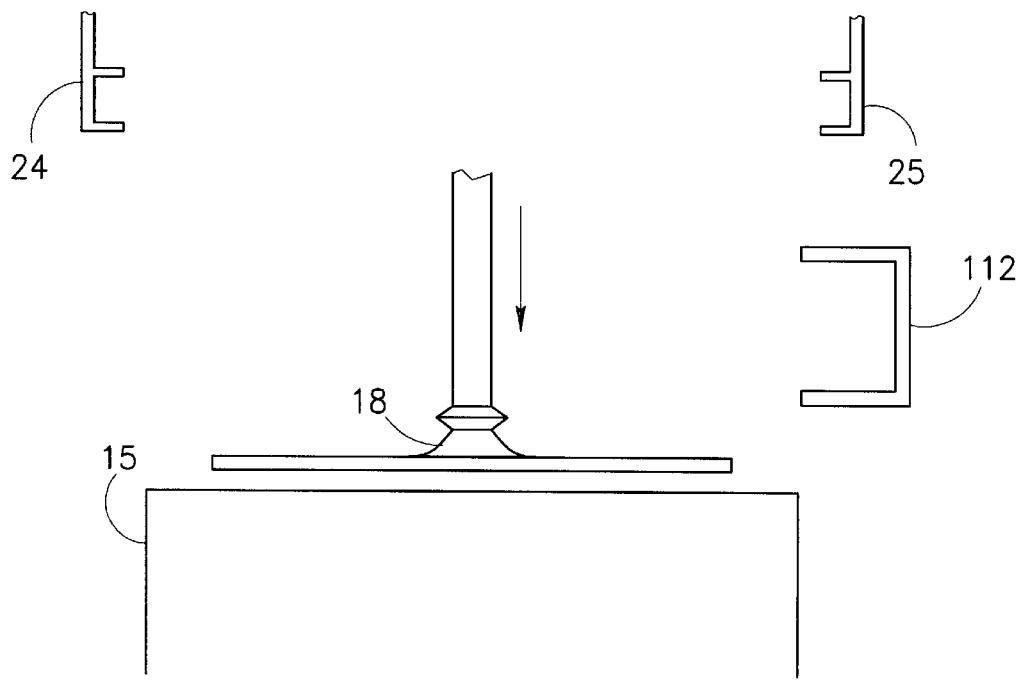

In an alternative embodiment of the present invention, another type of wafer orientation, known as pre-alignment, can be performed in the vicinity of buffer station 22, although this requires additional equipment. Reference is now made to FIGS. 6A, and 6B which illustrate this alternative embodiment in two different states, to FIGS. 6C and 6D which are useful in understanding the operation of the embodiment of FIGS. 6A and 6B and to FIGS. 7A and 7B which provide an alternative embodiment of the pre-alignment unit.

In this embodiment of the present invention, the handling system additionally includes a pre-alignment unit 112 located along the path of gripper 18. In FIGS. 6A and 6B, pre-alignment unit 112 is located between buffer station 22 and measurement unit 15. Pre-alignment unit 112 is similar to that described in U.S. patent application Ser. No. 09/097,298, assigned to the common assignees of the present invention and incorporated herein by reference. Accordingly, the details of operation of pre-alignment unit 112 will not be described herein As discussed U.S. patent application Ser. No. 09/097,298, pre alignment unit 112 detects the presence of a marker which is standardly present on wafers. Such a marker can be a flat line (a "flat") crossing a small portion of the edge of the wafer or a notch, and is used to define the fiducial axis of the wafer.

Pre-alignment unit 112 is a moveable opto-couple detector, focused on the edge of wafer W, which comprises a point illuminator 116, such as a light emitting diode (LED), a single photodiode 118, a photodiode lens 119 and a translation mechanism, indicated by arrow 121. The translation mechanism holds pre-alignment unit 112 and moves it into and out of its place above the wafer edge.

FIG. 6A shows pre-alignment unit 112 in a first, detecting position, surrounding an edge area 60 of the wafer and FIG. 6B shows pre-alignment unit 112 in a second, non-detecting position away from the path of gripper 18.

Figure 6C:
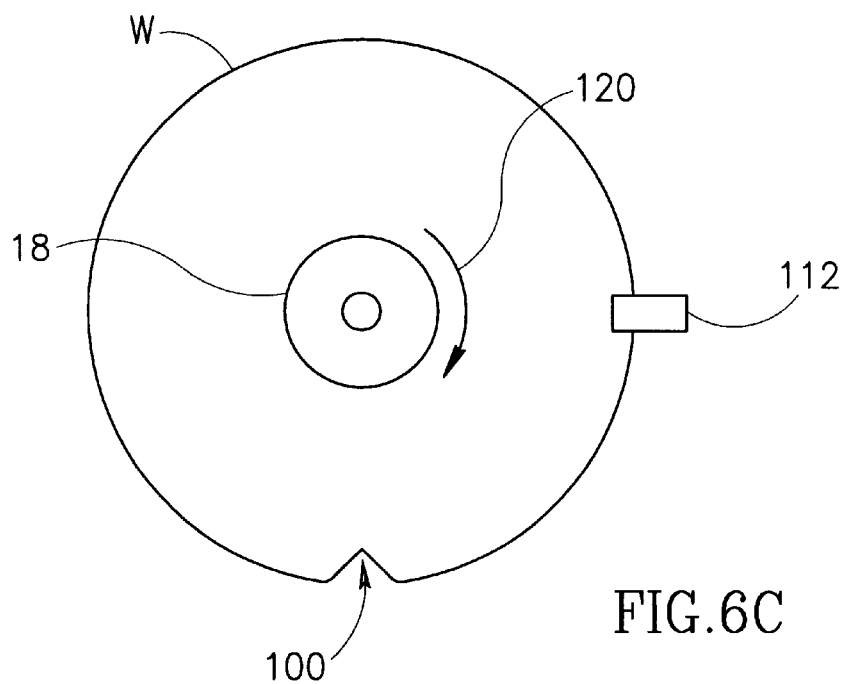
FIGS. 6C and 6D are schematic illustrations of a wafer in various stages of alignment, useful in understanding the operation of the pre-alignment unit of FIGS. 6A and 6B.

While buffer station 22 is in its open position, gripper 18 holds wafer W at the height of pre-alignment unit 112. Pre-alignment unit 112 is then brought into the first position shown in FIG. 6A. FIG. 6C illustrates the original, arbitrary orientation of the wafer W. As indicated by arrow 120 in FIG. 6C, gripper 18 rotates the wafer W until a marker 100 (e.g., a flat or a notch) passes the pre-alignment unit 112 which then indicates such to the integrated monitoring tool's control unit (not shown).

Figure 6D:
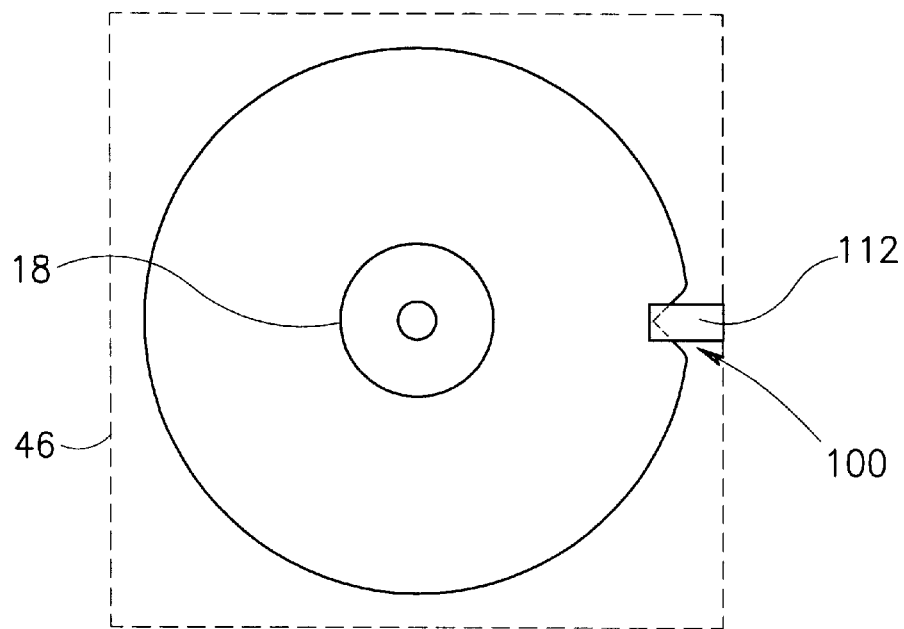

Specifically, the point illuminator 116 illuminates the bottom side of the edge area 60 of the wafer W whereas the single photodiode 118 detects signals above the edge area 60. Whenever the marker is not located between the elements of the pre-alignment unit 112, no light from the point illuminator 116, above a predetermined threshold level, can reach the photodiode 118. However, once the photodiode 118 detects a significant signal, i.e., the marker is between the elements of the detector 112, the control unit stops the rotation of gripper 18. The wafer W is now in a generally known position, near the detector 112 as shown in FIG. 6D, although its precise orientation is still unknown.

The pre-alignment unit 112 is now returned to the side, as shown in FIG. 6B, and, typically, gripper 18 brings the now pre-aligned wafer W to measurement unit 15.

Figure 7A:
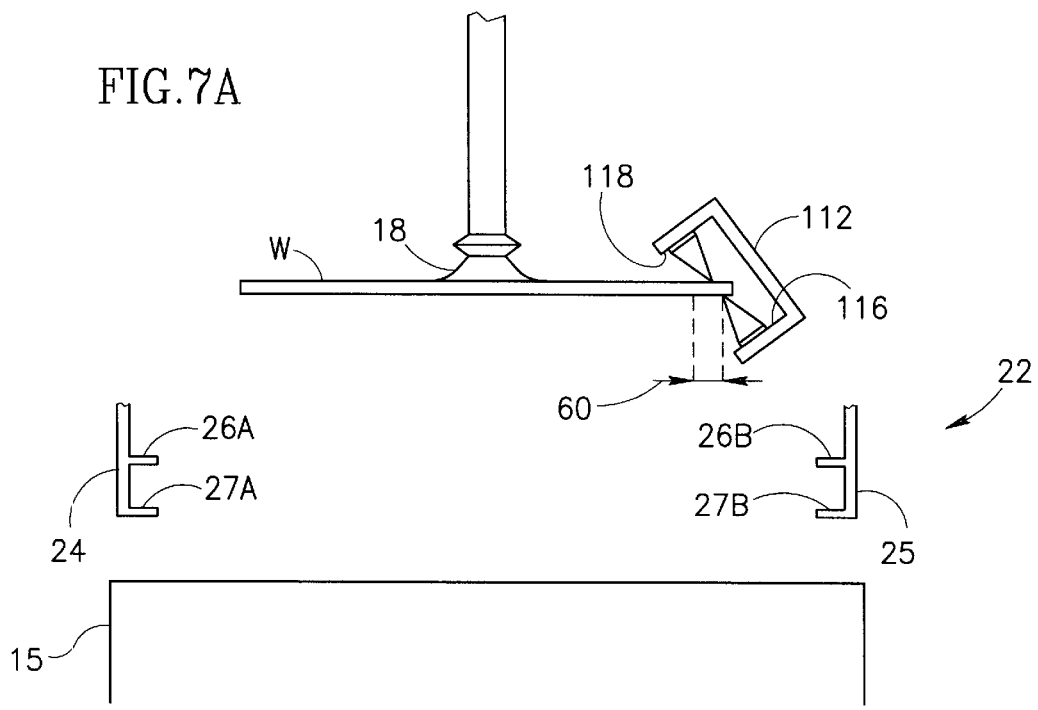
FIGS. 7A and 7B are schematic illustrations useful in understanding are schematic illustrations of an alternative embodiment of the pre-alignment unit, in two different stages of operation.
Figure 7B:
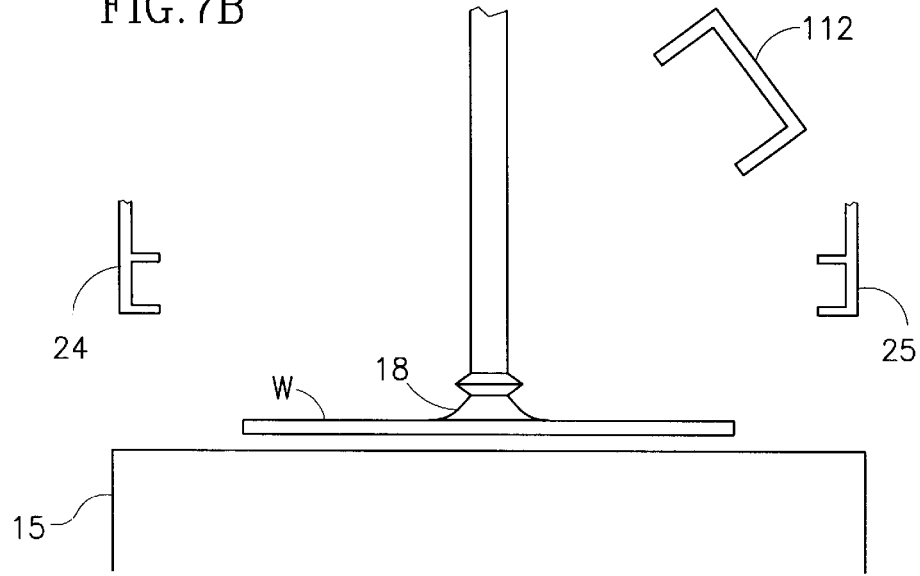

FIGS. 7A and 7B illustrate another preferred embodiment of the pre-alignment unit 112 which eliminates the need to insert and remove the pre-alignment unit 112 to and from the gripper's 18 translation path. FIG. 7A shows a configuration in which buffer station 22 is located between measuring unit 15 and pre-alignment unit 112. Pre-alignment unit 112 is tilted and located in a position above the uppermost position of gripper 18. This position is the furthest position from measuring unit 15.

Gripper 18 first takes the wafer W (generally, an unmeasured wafer) from upper supporting bases 26 and brings it into pre-alignment unit 112. Since pre-alignment unit 112 is tilted such that its lower half is away from the path of gripper 18, wafer W does not hit anything during this operation.

When gripper 18 is in its uppermost position, point illuminator 116 illuminates the bottom side of the edge area 60 of the wafer W while photodiode 118 detects signals above the edge area 60. When pre-alignment is completed, gripper 18 lowers the wafer, away from prealignment unit 112, through the now open buffer station 22, to measuring unit 15, as shown in FIG. 7B. Once again, since pre-alignment unit 112 is tilted, gripper 18 can move wafer W into and out of unit 112 without unit 112 having to move.

It is noted that the buffer station 22 can be used with an integrated monitoring tool in which the measuring unit is located above the handling system. However, for this alternative embodiment, supporting beams 24 and 25 should be placed so that their supporting bases 26 and 27 face the measuring unit rather than as in the previous embodiment. Pre-alignment unit 112 would then be below buffer station 22, in the location furthest from measuring unit 15.

Figure 8:
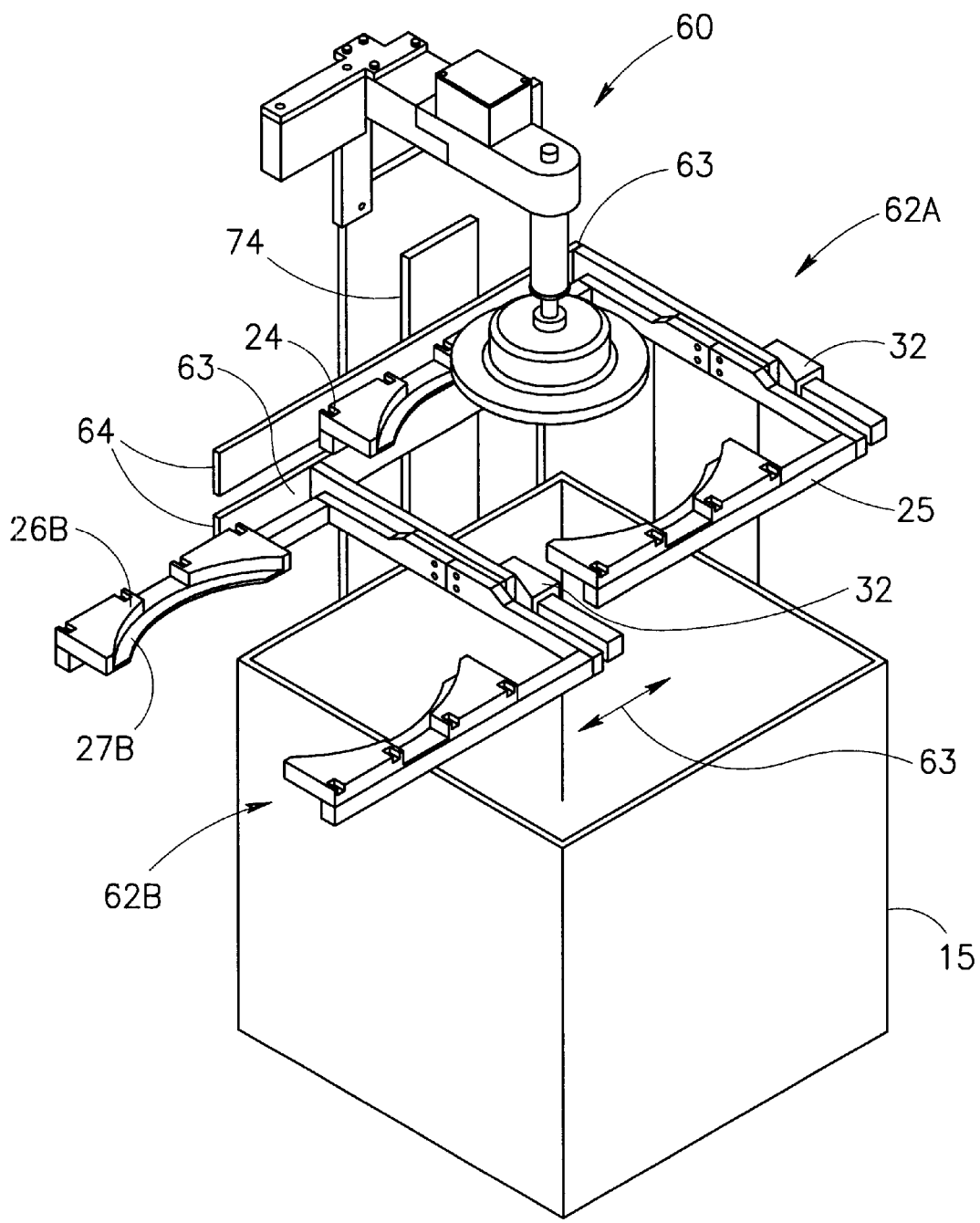
FIG. 8 is a schematic illustration of integrated monitoring tool and handling system having two buffer stations, constructed and operative in accordance with an alternative preferred embodiment of the present invention.
Figure 9A:
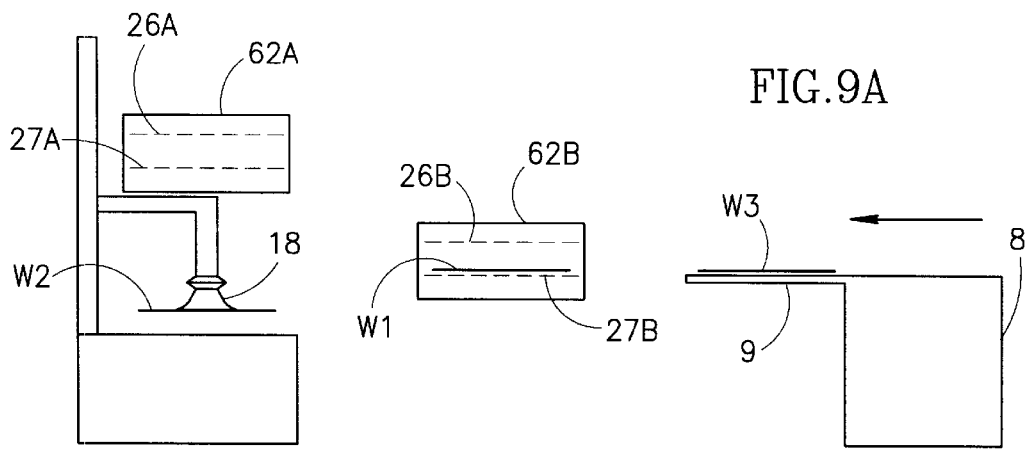
FIGS. 9A, 9B and 9C are schematic illustrations indicating the operation of the system of FIG. 8.
Figure 9B:
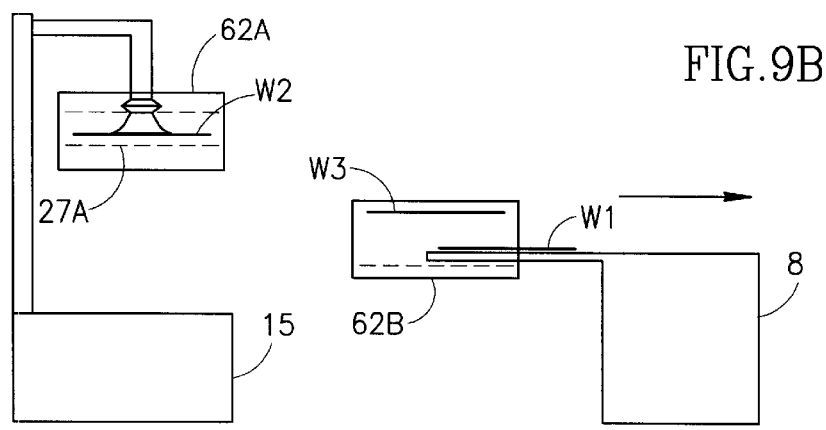
Figure 9C:
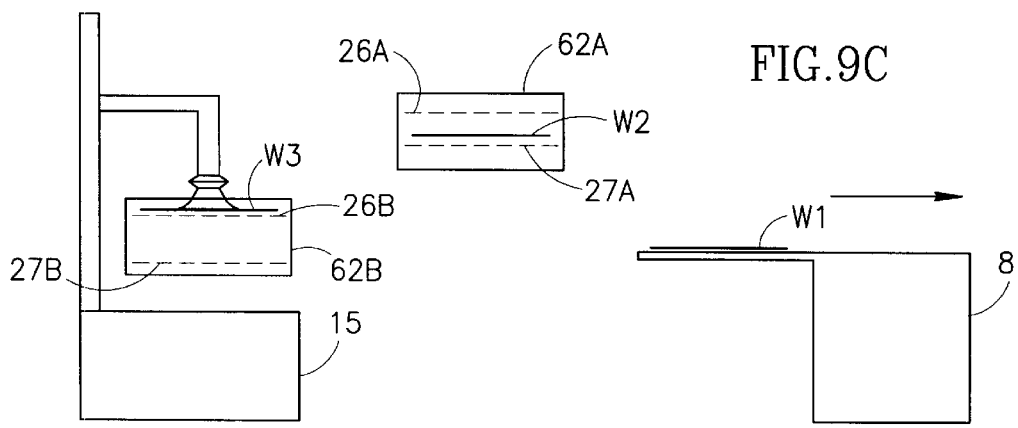

Reference is made to FIG. 8, which illustrates a handling system 60 according to another preferred embodiment of the present invention having a buffer station with two pairs of supporting arms 62A and 62B. Similar reference numbers refer to similar elements. Reference is also made to FIGS. 9A, 9B and 9C which illustrate the combined operation of handling system 60, supporting arms 62A and 62B and the robot 8.

As in the previous embodiment, pairs of supporting arms 62A and 62B can be located above measuring unit 15 and, typically, they have elements similar to those of buffer station 22. However, in this embodiment, each pair of supporting arms 62A and 62B is separately movable away from the path of gripper 18, as indicated by arrow 63', typically via a side rail 64 that is controlled by a motor (not shown). Thus, FIG. 8 shows arms 62A within the path of gripper 18 while arms 62B are out of the path. As in the previous embodiment, each pair of supporting arms 62A and 62B includes relative motion mechanism 32 that separates supporting beams 24 and 25 enough to allow the passage of gripper 18 therethrough.

It is noted that, in this embodiment, each side rail 64 is mounted on coupling member 74, where each pair of supporting arms 62A and 62B is associated to side rail 64 via side translation unit 63. However, it should be emphasized that any other suitable non-linear motion, e.g., rotation, may be used to move the supporting arms into and out of the path of gripper 18 (and to any intermediate point as well).

According to a preferred embodiment, it is sufficient that each supporting arm have a single supporting base 26. However, FIG. 8 shows each supporting arm 24 and 25 with two supporting bases 26 and 27 which increases the buffering capacity of the buffer station, as will be described hereinbelow.

FIGS. 9A, 9B and 9C illustrate the operation of handling system 60. As illustrated by FIG. 9A, pair of supporting arms 62A is in the open position within the path of gripper 18 while pair of supporting arms 62B is in the closed position out of the path of gripper 18.

A measured wafer W1 is present on lower supporting bases 27B of pair of supporting arms 62B while a second wafer W2 is handled by gripper 18 e.g., is being measured or is being placed in a measuring position on measuring unit 15. Generally simultaneously, robot 8 arrives with a third wafer W3 to be measured, and places it on the uppermost supporting bases 26B of pair of supporting arms 62B.

As illustrated by FIG. 9B, when robot 8 finishes placing new wafer W3 on upper supporting bases 26B, robot 8 takes measured wafer W1 from lower supporting bases 27B and returns to conduct other missions. Generally simultaneously, pair of supporting arms 62A closes and gripper 18 places now measured second wafer W2 on supporting bases 27A.

As illustrated by FIG. 9C, pairs of supporting arms 62A and 62B change positions, such that pair of supporting arms 62B, with new wafer W3 thereon, enters the path of gripper 18 while pair of supporting arms 62A, with measured wafer W2 thereon, moves out of the path of gripper 18. Gripper 18 can now load third wafer W3 from upper supporting bases 26B and, once pair of supporting arms 62B opens up, can place new wafer W3 on measuring unit 15. When the measurement of this third wafer W3 is finished, it will be placed by gripper 18 onto supporting bases 27B and the buffering cycle continues. In the meantime, robot 8 can load measured wafer W2.

Thus, this buffering method enables robot 8 to unload a new wafer to be measured and to load a measured wafer, generally, while a third wafer is being handled by handling system 20. Thus, robot 8 and handling system 8 are relatively independent of each other in this embodiment.

Figure 10:
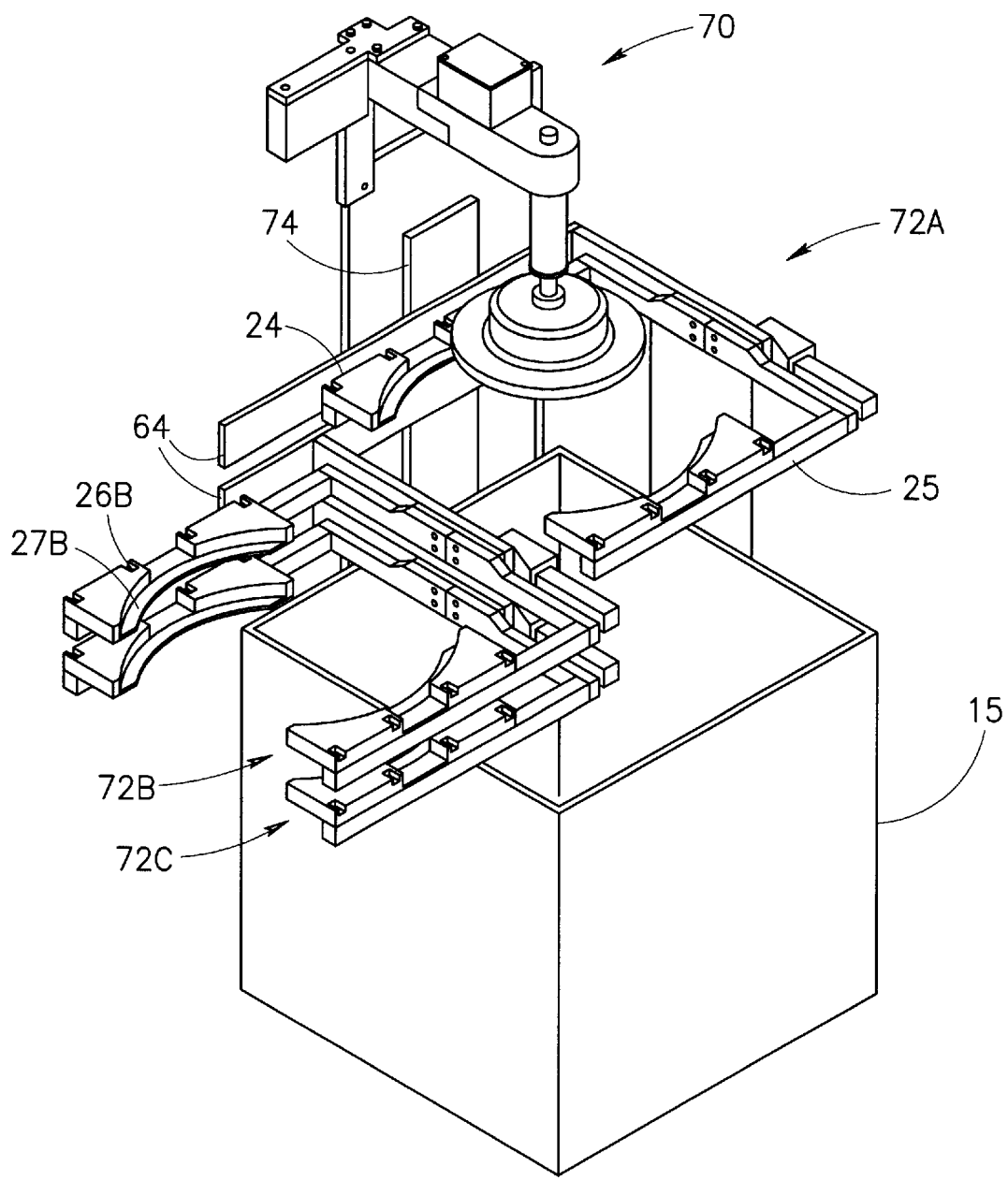
FIG. 10 is a schematic illustration of an integrated monitoring tool and handling system having three buffer stations, constructed and operative in accordance with a further preferred embodiment of the present invention.

Reference is made to FIGS. 10 and 11 which illustrate a further handling system 70 and its operation, respectively. In this embodiment, handling system 70 comprises three pairs of supporting arms 72A, 72B and 72C, each formed in a manner similar to pairs of supporting arms 62 of the previous embodiment. Similar reference numerals refer to similar elements. Thus, each pair of supporting arms 72 has supporting beams 24 and 25 and each pair of supporting arms 72 moves between an in-path and an out-of-path position with respect to gripper 18. Typically, only one pair of supporting arms 72 is in the in-path position at any given time.

Figure 11A:
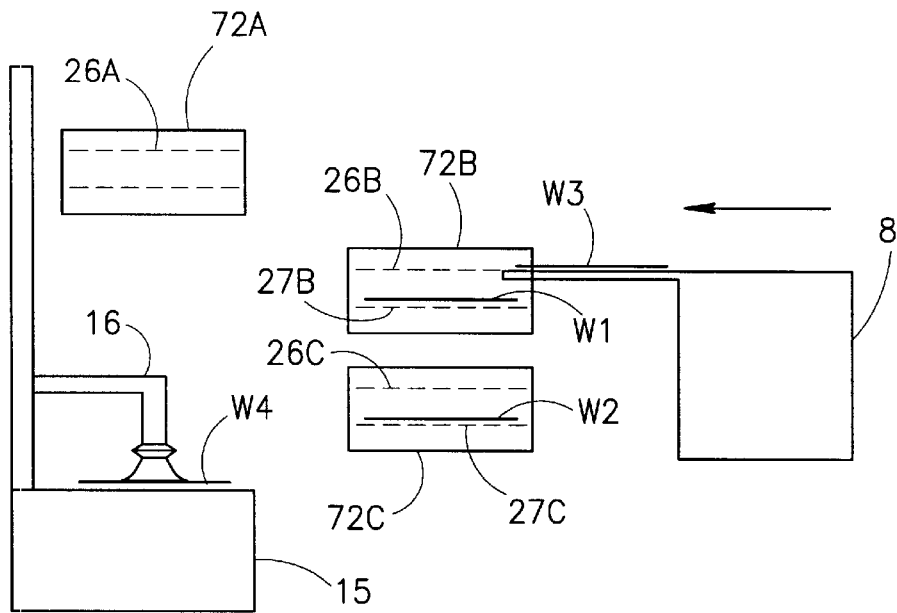
FIGS. 11A, 11B and 11C are schematic illustrations indicating a first operation of the system of FIG. 10.
Figure 11B:
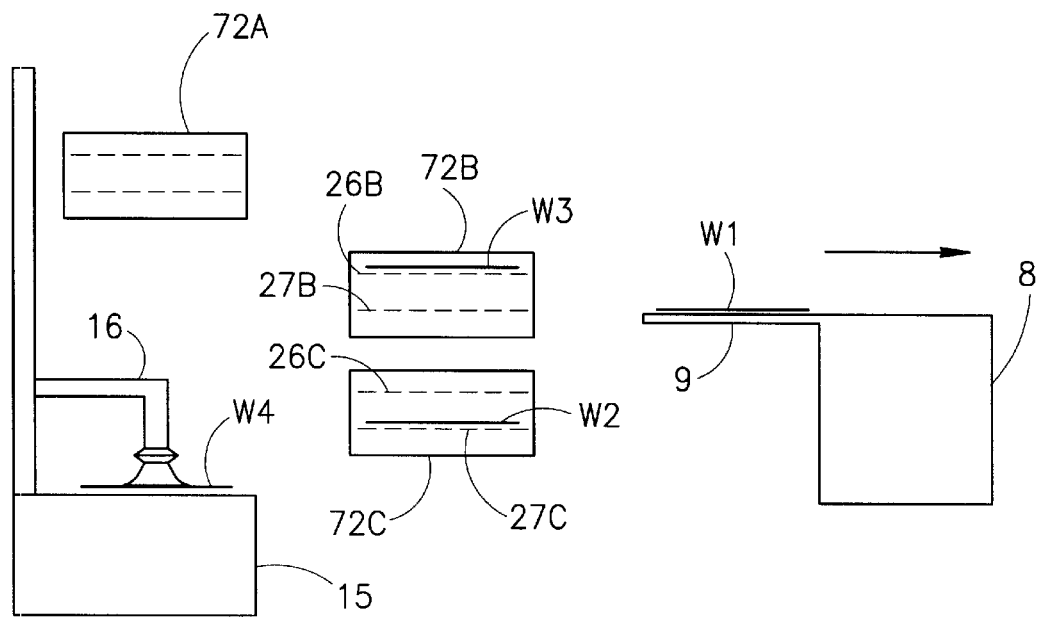
Figure 11C:
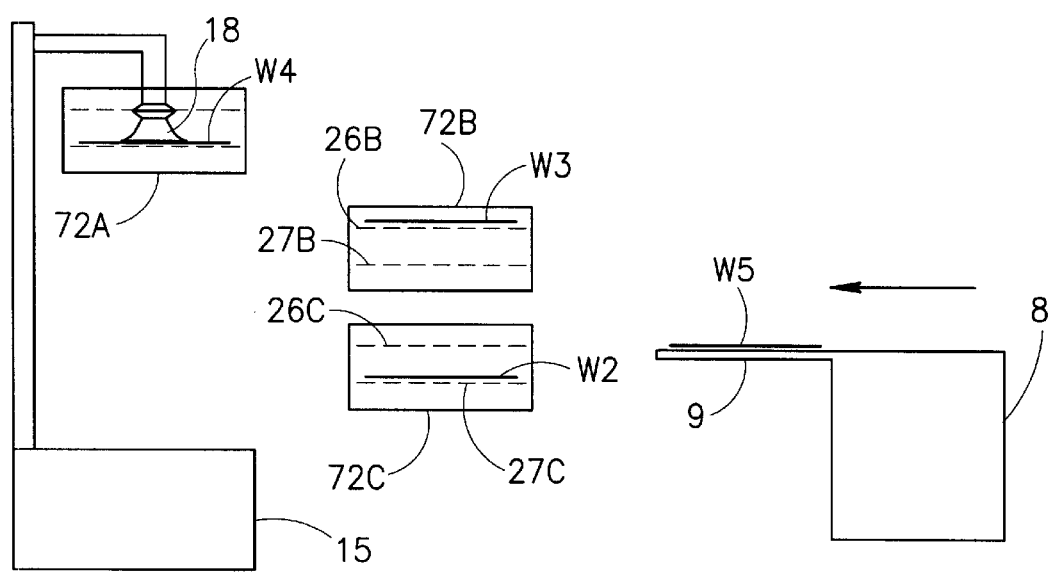

FIGS. 11A, 11B and 11C show the operation of handling system 70. This embodiment is particularly useful for a process environment with high throughput and thus, a high buffer capacity is needed to enable the operation of robot 8 and tool 6 to be sufficiently independent of each other.

FIG. 11A illustrates a point in time at which two measured wafers W1 and W2 are already present on the lower supporting bases 27B and 27C of out-of-path pairs of supporting arms 72B and 72C, respectively. At the same time, gripper 18 handles another wafer W4 (e.g., the wafer is being measured or it is being brought to or from measuring unit 15). Accordingly, supporting arms 72A are open in the in-path position. FIG. 11A also shows robot 8 loading a new wafer W3 onto upper bases 26B of pair of supporting arms 72B.

As illustrated in FIG. 11B, when robot 8 finishes unloading and placing new wafer W3, it takes measured wafer W1 from lower supporting bases 27B of pair of supporting arms 72B and returns to its other missions. According to this preferred embodiment, robot 8 can generally immediately return back with a new wafer W5, as illustrated in FIG. 11C, and can place it on any available supporting base, such as base 27C.

While robot 8 is performing its operations, gripper 18 moves wafer W4 through the measurement process. Thus, it is shown on measuring unit 15 in FIG. 11B and on supporting bases 27A of closed pair of supporting arms 72A in FIG. 11C.

It is noted that, in general, pairs of supporting arms can be added to increase the buffer capacity of the handling system. It will be appreciated that, although two supporting bases are shown for each pair of supporting arms station, it is possible to have more or less, as needed.

Figure 12A:
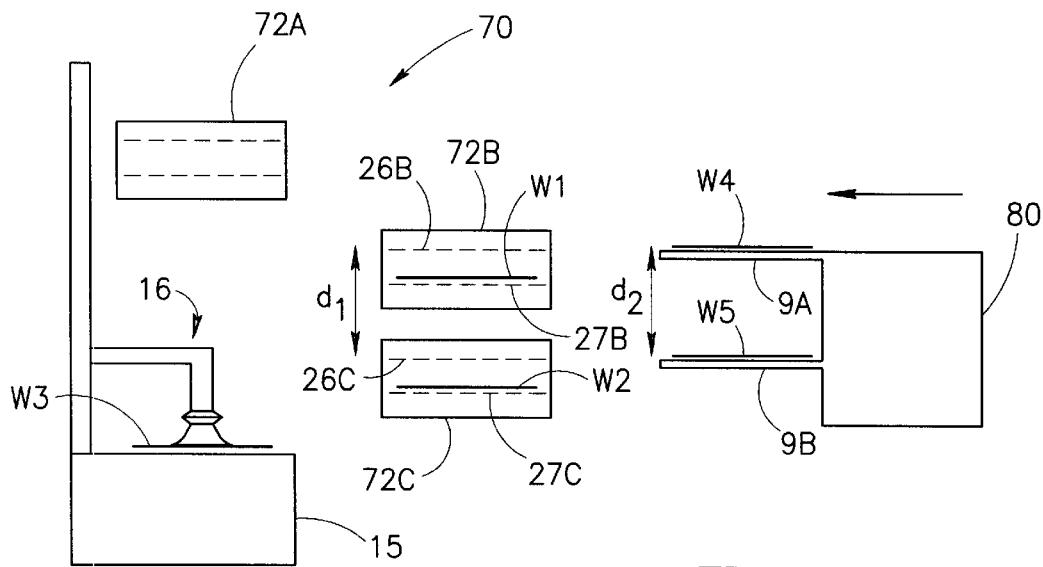
FIGS. 12A and 12B are schematic illustrations indicating a second operation of the system of FIG. 10 with a robot having two arms.
Figure 12B:
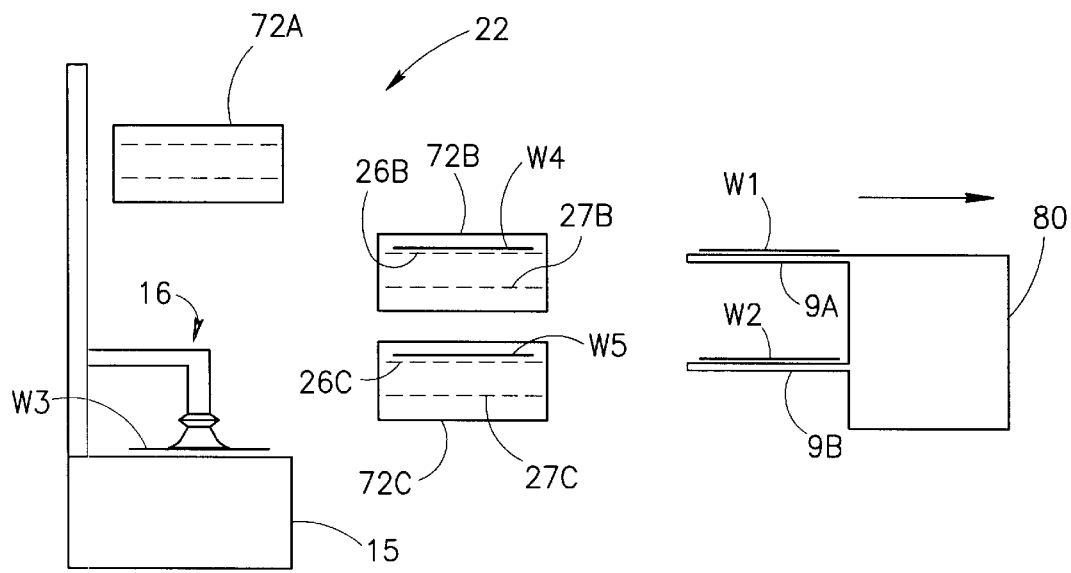

It will be appreciated that the present invention can operate with a robot 80 that can simultaneously carry two or more wafers (e.g., a semi or full wafer cassette). This is illustrated in FIGS. 12A and 12B to which reference is now made. The embodiment of FIGS. 12A and 12B uses handling system 70 of FIG. 10 and thus, similar reference numerals refer to similar elements.

In this embodiment, robot 80 must be able to simultaneously deliver all its wafers to the relevant buffer station, e.g., each wafer should be placed onto a different supporting base. Therefore, as illustrated in FIG. 12A, two measured wafers W1 and W2 are present on the lower supporting bases 27B and 27C, respectively, while pairs of supporting arms 72B and 72C are in the out-of-path position. At the same time, another wafer W3 is handled by gripper 18 while pair of supporting arms 72A is in the in-path position. Generally simultaneously, robot 80 carries two new wafers W4 and W5 on its two arms 9A and 9B, respectively.

It is noted that a height difference d1 between upper supporting bases 27B and 27C of pairs of supporting arms 72B and 72C is generally equal to a height difference d2 between the wafers W4 and W5 carried on arm 9A and 9B of robot 80. When robot 80 arrives at pairs of supporting arms 72B and 72C, it can unload wafers W4 and W5 together to the upper supporting bases 26B and 26C and then it can load measured wafers W1 and W2 together from lower supporting bases 27B and 27C, after which it returns to its other missions, as illustrated in FIG. 12B.

It will be appreciated that each of the embodiments shown herein can also include pre-alignment unit 112 (FIGS. 6 and 7) and can perform the centering operations shown in FIGS. 5A and 5B.

In certain kinds of wafer processing techniques, such as wafer polishing, the wafer is submerged in a liquid, such as a slurry, held in a processing chamber. It is essential that the wafer remains 100% wet upon removal from the wet environment. In some polishing systems, the wafer may be kept out of a wet environment for only 5–40 seconds after being polished. There is thus a need, in such systems, for maintaining the wafer wet in the buffer stations described hereinabove, before measuring or processing.

Figure 13:
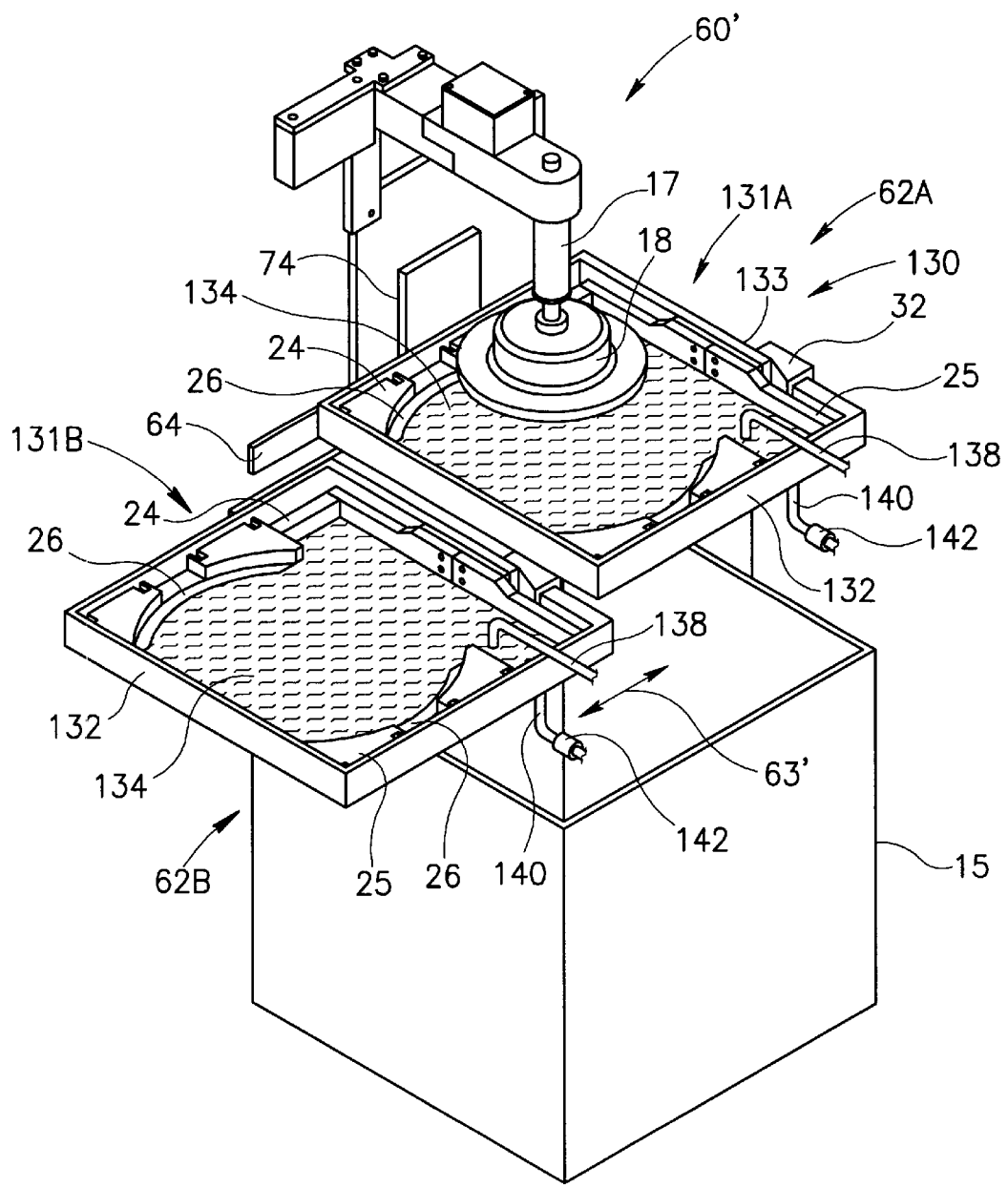
FIG. 13 is a simplified pictorial illustration of apparatus for maintaining objects wet in a buffer station, constructed and operative in accordance with a preferred embodiment of the present invention.

Reference is now made to FIG. 13, which illustrates a handling system 60' including a buffer station 130 for maintaining articles wet, in accordance with a preferred embodiment of the present invention. It should be emphasized that the invention is suitable for handling any article that must be kept in a liquid environment during handling, such as, but not limited to, the wafers mentioned hereinabove.

In accordance with a preferred embodiment of the invention, buffer station 130 comprises two receptacles 132 in which two supporting assemblies 131a and 131b are disposed. Each supporting assembly 131a and 131b comprises one or more supporting elements preferably two supporting beams 24 and 25 each provided by a supporting base 26. The supporting elements form a supporting plane on which an article, such as wafer W described hereinabove, is held entirely or partially immersed in a liquid, e.g., purified water.

Receptacle 132 is generally shaped like a rectangular tray, which envelopes supporting beams 24 and 25, it is appreciated that any other suitable shape is in the scope of the invention. Relative motion mechanism 32 is preferably connected to at least one of supporting beams 24 and 25 through a watertight or waterproof connection 133, such as a suitable elastomeric gasket. Alternatively, relative motion mechanism 32 may be a watertight or waterproof unit itself, in which case receptacle 132 may additionally envelope relative motion mechanism 32. The movement of at least one of the supporting elements (such as either of supporting beams 24 and 25) enables centering of the article as described hereinabove with reference to FIGS. 5A, 5B and FIG. 8.

It should be noted that supporting assemblies 131a and 131b may comprise any number of supporting elements, e.g., three, one of which is movable by any suitable driving device. Supporting elements may be assembled directly on the receptacle 132 or formed integrally as part of receptacle 132.

As shown in FIG. 13, supporting assemblies 131a and 131b may be located above measuring unit 15. In general, handling system 60' is constructed similarly to system 60 of FIG. 8, and operates in a similar manner. In this embodiment, each supporting assembly 131a and 131b disposed within its corresponding receptacle 132, is separately movable away from the 4 path of gripper 18, as indicated by arrow 63', typically via side rail 64 that is controlled by a suitable driver, e.g., a linear motor (not shown). FIG. 13 shows supporting assembly 131a within the path of gripper 18 while supporting assembly 131 b is out of the path.

As described hereinabove, each side rail 64 is mounted on coupling member 74, and each supporting assembly 131a and 131b, disposed within its corresponding receptacle 132, is coupled to side rail 64 via side translation unit 63. Side translation unit 63 is preferably connected to the outside of receptacle 132. As mentioned hereinabove, any other suitable non-linear motion, e.g., rotation, may be used to move the supporting arms into and out of the path of gripper 18 (and to any intermediate point as well).

Receptacle 132 is preferably at least partially filled with a liquid 134, such as distilled water, for example. An article, such as a semiconductor wafer, is preferably entirely or partially submerged in liquid 134. Liquid 134 is preferably fed to receptacle 132 from a liquid reservoir (not shown) via one or more conduits 138. Liquid may be fed to receptacles 132 by any suitable pump, e.g., a pump of the polisher or a separate pump (not shown). Conduit 138 may introduce liquid 134 over the upper surface of receptacle 132, or alternatively may introduce liquid 134 through holes (not shown) formed in receptacles 132. A drain conduit 140 is preferably coupled to a bottom portion of each receptacle 132. For example, the bottom portion of receptacle 132 may be formed as a sump (not shown) and drain conduit 140 may be connected to the sump. The sump catches any spillage of liquid 134 and drains the liquid via drain conduit 140. The liquid supply may be recirculated, wherein the opposite end of drain conduit 140 is in fluid communication with the liquid supply reservoir. Filters (not shown) may be provided to filter liquid 134 before re-entering the supply reservoir.

Preferably, in order to avoid contamination, the liquid in receptacles 132 is totally replaced for each new article. As another measure to prevent contamination, the liquid may be continuously recirculated while articles are maintained within receptacles 132 on supporting assembly 131a and 131b. In such a case, each drain conduit 140 may be provided with a suitable drain valve 142, which is operated by a suitable control unit (not shown).

Figure 14A:
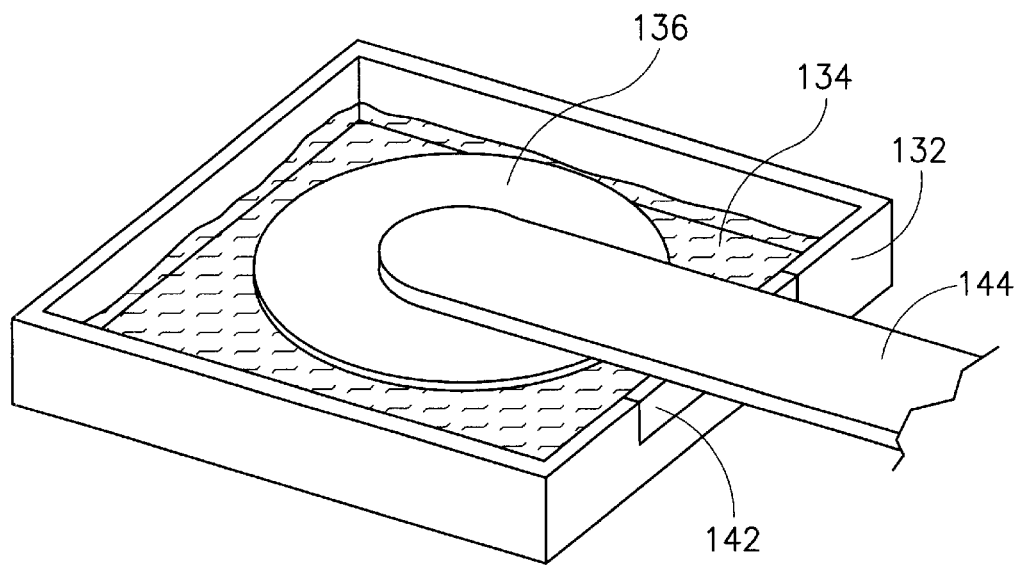
FIGS. 14A and 14B are simplified illustrations of an alternative embodiment of the apparatus of FIG. 13, wherein a receptacle is provided with a flexible, foldable gate, FIGS.
Figure 14B:
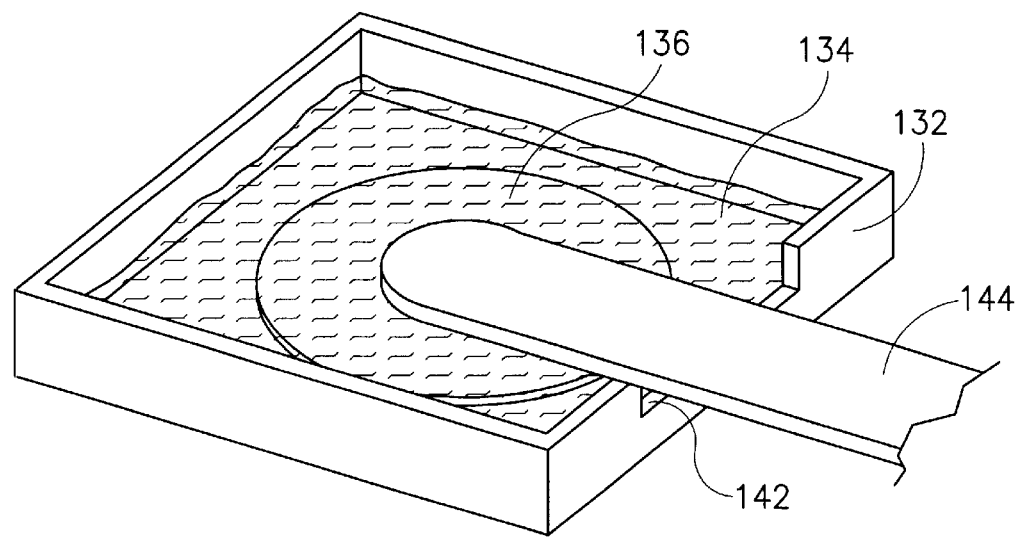

FIGS. 14A and 14B illustrate an alternative embodiment, wherein receptacle 132 is provided with a flexible gate 142, such as an elastomeric flap hinged to receptacle 132. Flexible gate 142, when closed, substantially seals flow of liquid 134 from receptacle 132. Such an embodiment is designed for use with a generally flat robot arm 144. As seen in FIG. 14B, as robot arm 144 lowers article 136 into receptacle 132 in order to put it on the supporting assembly, arm 144 folds flexible gate 142 so that there is no interference to the motion of arm 144. Any liquid 134 which may spill out during insertion of article 136 into receptacle 132, due to folding of flexible gate 142, is collected by a system sump (not shown). After insertion of article 136 into receptacle 132, flexible gate 142 returns to its original shape as in FIG. 14A. Alternatively, instead of a hinged elastomeric flap, flexible gate 142 may be manufactured from any flexible flap that is foldable by robot arm 144 when lowered thereupon.

Figure 15:
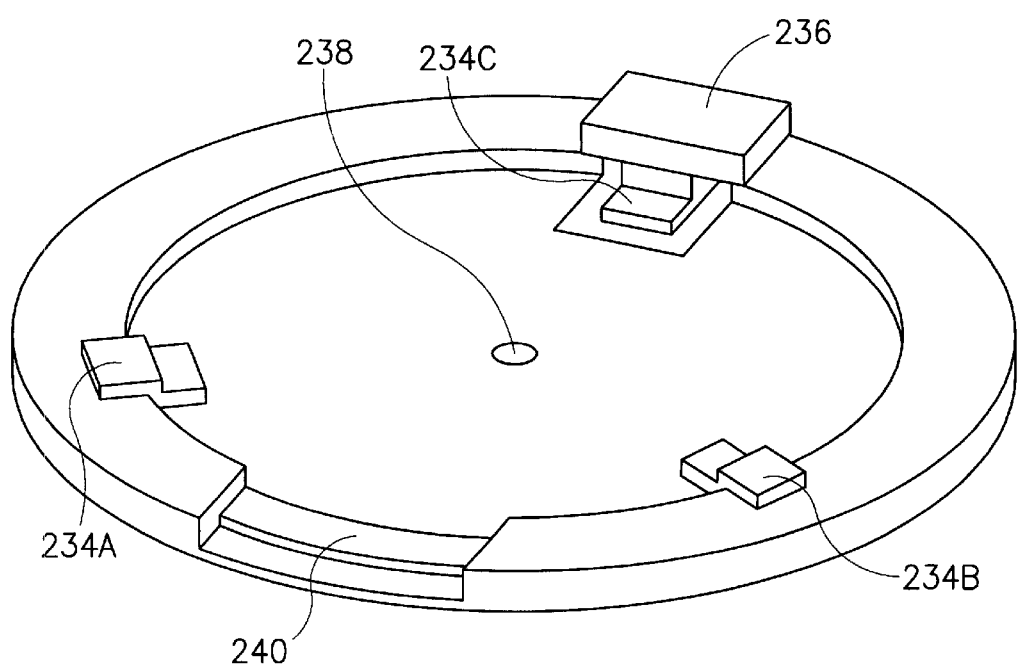
FIG. 15 is a simplified pictorial illustration of a supporting assembly for maintaining objects wet in a buffer station, constructed and operative in accordance with an alternatively preferred embodiment of the present invention.

Reference is now made to FIG. 15, which illustrates a supporting assembly 231 for maintaining objects wet in a buffer station, constructed and operative in accordance with an alternatively preferred embodiment of the present invention. Supporting assembly 231 preferably includes a receptacle 232, generally shaped like a circular tray, although any other arbitrary shape is within the scope of the invention. Receptacle 232 includes therein one or more supporting elements. In the illustrated embodiment, three supporting elements 234a, 234b and 234c form together a supporting plane on which an article, such as wafer W, may be held entirely or partially immersed in a liquid, such as purified, e.g. distilled water. The supporting elements may be assembled together with receptacle 232, or may be manufactured as one integral part of receptacle 232.

A relative motion mechanism (not shown), such as a servomotor or linear actuator, is preferably located within a sealed cover 236, and is connected to supporting element 234c. Preferably, the supporting surfaces of supporting elements 234a, 234b and 234c are slightly inclined towards the center of supporting assembly 231. Supporting elements 234a and 234b are preferably stationary. As relative motion mechanism moves supporting element 234c radially inwards, the article abuts against supporting elements 234a and 234b and is centered. It is of course appreciated that the centering operation may be accomplished with other combinations of relative motion of the supporting elements.

A drain valve or shutter 238 is preferably located at the bottom of receptacle 232, and is connected to an appropriate driver (not shown) located within sealed cover 236. Opening drain valve 238 drains liquid from receptacle 232. Preferably, the bottom of receptacle 232 is sloped towards its center in order to provide full drain of liquid therefrom. A recess 240 in the side of receptacle 232 may be provided for draining excessive or overflow liquid to the system sump (not shown).

As described hereinabove, the supporting assemblies of the present invention may be moved linearly in translation, such as by means of side translation unit 63, described hereinabove, or may be moved in rotation.

As mentioned hereinabove, any of the embodiments of the present invention may include pre-alignment unit and are capable of performing the pre-alignment operations shown in FIGS. 6A–6D.

The handling system 60' preferably includes a cover (not shown), which covers the area of arm 17 and gripper 18, to prevent any outward splashing of water from receptacles 132. The cover may be constructed of any transparent or translucent structural plastic, for example. Preferably, the handling system is provided with a liquid-collecting tray that serves as a system sump for collecting and draining any excess liquid or spills from receptacles 132.

It will be appreciated by persons skilled in the art that the present invention is not limited by what has been particularly shown and described herein above. Rather the scope of the invention is defined by the claims that follow:

What is claimed is:

1. A buffer station for an article handling system, the handling system having a general path along which it moves when handling the article, the buffer station comprising:

at least two supporting assemblies comprising supporting elements forming a supporting plane each capable of supporting an article within said supporting plane and located so as to support said article within said general path;

at least two receptacles for liquid in which said at least two supporting assemblies are disposed; and at least two drivers associated with said at least two supporting assemblies and said receptacles for shifting them in and out of said general path.

2. The buffer station according to claim 1 and wherein at least one of said supporting elements is movable along and connected to a centering driver.

3. The buffer station according to claim 1 wherein said receptacle comprises a foldable gate, which when closed substantially seals flow of liquid from said receptacle.

4. The buffer station according to claim 1 wherein said gate is flexible.

5. The buffer station according to claim 1 wherein each of said supporting assemblies comprising at least two supporting elements forming the supporting plane.

6. The buffer station according to claim 1 wherein each of said supporting assemblies comprising at least three supporting elements forming the supporting plane.

7. The buffer station according to claim 1 wherein said receptacles are further provided with at least one conduit in fluid communication with a liquid source.

8. The buffer station according to claim 7 wherein said at least one drain conduit is further provided with at least one drain valve.

9. The buffer station according to claim 8 wherein said at least one drain valve is operated by a control unit.

10. The buffer station according to claim 7 wherein said liquid is purified water.

11. The buffer station according to claim 1 further including a pre-alignment unit located within a general path of said handling system.

12. The buffer station according to claim 11 wherein said pre-alignment unit is movable in and out of said general path.

13. The buffer station according to claim 11 wherein said pre-alignment unit is tilted with respect to a general path of said handling system.

14. The buffer station for an article handling system according to claim 1 and comprising an article within said supporting plane, wherein said article is a semiconductor wafer.

* * * * *